United States Patent [19]
Tohyama

[11] Patent Number: 4,810,907
[45] Date of Patent: Mar. 7, 1989

[54] SEMICONDUCTOR RESISTANCE ELEMENT USED IN A SEMICONDUCTOR INTEGRATED CIRCUIT

[75] Inventor: Kay Tohyama, Kawasaki, Japan

[73] Assignee: Fujitsu Limited, Kawasaki, Japan

[21] Appl. No.: 221,019

[22] Filed: Jul. 1, 1988

Related U.S. Application Data

[63] Continuation of Ser. No. 865,821, May 22, 1986, abandoned.

[30] Foreign Application Priority Data

May 28, 1985 [JP] Japan .................. 60-115855

[51] Int. Cl.$^4$ .................. H03K 19/94; H03K 19/20
[52] U.S. Cl. .................. 307/475; 307/296 R; 307/363; 307/304
[58] Field of Search .................. 307/296 R, 363, 303, 307/304, 475; 357/51

[56] References Cited

U.S. PATENT DOCUMENTS

| | | | |
|---|---|---|---|
| 4,423,339 | 12/1983 | Seelbach et al. | 307/464 |
| 4,631,426 | 12/1986 | Nelson et al. | 307/458 |

FOREIGN PATENT DOCUMENTS 0053664  6/1982  European Pat. Off.

OTHER PUBLICATIONS

EDN Electrical Design News, vol. 23, No. 17, Sep. 1978, pp. 44–52; S. Davis: "GaAs metal–Semiconductor technology promises gigahertz LSI at low power".
IBM Technical Disclosure Bulletin, vol. 20, No. 7, Dec. 7, 1977, pp. 2744–2745, New York; D. L. Bergeron et al.: "Merged junction field-effect resistor".
GaAs IC Symposium, Technical Digest, Phoenix, 25–27 Oct. 1983, pp. 158–161, IEEE, NY; M. Abe et al.: "Hemt LSI technology for high speed computers".
European Search Report, The Hague, 7-2-86.

Primary Examiner—John S. Heyman
Assistant Examiner—Richard Roseen
Attorney, Agent, or Firm—Staas & Halsey

[57] ABSTRACT

A semiconductor resistance element used in a semiconductor integrated circuit containing a plurality of MESFET's or JFET's as an active element, for interconnecting the active elements or for connecting to the external circuit, etc. This semiconductor resistance element is constituted by interconnecting the drain and gate electrodes of the MESFET or JFET and limiting the drain current thereof within a given range.

15 Claims, 6 Drawing Sheets

SEMICONDUCTOR RESISTANCE ELEMENT USED IN A SEMICONDUCTOR INTEGRATED CIRCUIT

This is a continuation of co-pending applicant Ser. No. 865,821 filed on May 22, 1986, now abandoned.

BACKGROUND OF THE INVENTION

1. Field of the Invention

The present invention relates to a semiconductor resistance element used in a semiconductor integrated circuit mainly having a Schottky gate FET (referred to as MESFET hereinafter) or a junction gate FET (referred to as JFET hereinafter).

2. Description of the Related Art

In an integrated circuit device in which a large number of MESFET's or JFET's are formed on a substrate, a resistance element formed on the same substrate is used for connecting between those FET's or to an external circuit in order to, for example, limit a current or divide a voltage. In general, this resistance element is constituted by an impurity region formed on the substrate. That is, the resistance element is formed by patterning an element region on the substrate, then introducing the impurity. The resistance value of the resistance element is determined on the basis of the density of the impurity and the size of the patterning.

This method is sufficient when a highly accurate resistance value is not required in the circuit of the IC device. When, however, a highly accurate resistance value is required, an integrated circuit having a high reliability cannot be obtained.

That is, in the prior art method for forming the resistor on the substrate, the resistance region must be patterned on the substrate, and further, the process of ion implantation, anneal, must be carried out. In these processes, however, due to errors in the patterning size or a varying of the process control conditions, the resistance value of the resistor will vary widely, and accordingly, the resistor formed on the substrate by the prior art method cannot be utilized for a circuit element which needs a high accuracy.

SUMMARY OF THE INVENTION

It is an object of the present invention to provide a semiconductor resistance element used in the semiconductor integrated circuit, in which the resistance value can be determined with a high accuracy.

According to a fundamental aspect of the present invention, there is provided a semiconductor resistance element for use in a semiconductor integrated circuit including a Schottky gate FET or a junction gate FET, each formed on a semiconductor substrate wherein the resistance element is constituted by the FET having drain and gate electrodes interconnected, and a drain current thereof is limited so that a drain-source voltage is limited under a turn on voltage of a diode formed between the gate and drain electrodes.

According to another aspect of the present invention, there is provided a level shift circuit used in the integrated circuit comprising; a first FET having a gate electrode to which an input voltage is applied; a second FET functioning as a constant current source; and a semiconductor resistance element as described above, wherein the first and second FET's and the semiconductor resistance element placed therebetween are connected in series between the power supply voltage and ground.

BRIEF DESCRIPTION OF THE DRAWINGS

Examples of a semiconductor resistance element according to the present invention will now be described with reference to the accompanying drawings, in which.

DESCRIPTION OF THE PREFERRED EMBODIMENT

For a better understanding of the present invention, the problems arising when the resistor made by the prior art method is used for the level shift circuit will be explained hereinafter.

Figure 1:
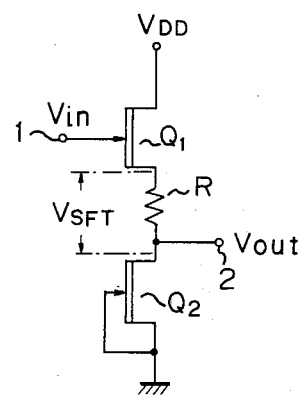
FIG. 1 and FIG. 2 show a level shift circuit of the prior art, respectively.

FIG. 1 is a circuit diagram of the level shift circuit using the resistor R as a voltage shift element. In FIG. 1, $Q_1$ and $Q_2$ are GaAs MESFET's wherein the gate metal thereof is a tungsten silicide ($WS_i$), respectively, R is the resistor used as the voltage shift element, which is made by the prior art method, 1 an input terminal, and 2 an output terminal. This level shift circuit is an example of the circuit which requires a highly accurate resistor.

In FIG. 1, MESFET's $Q_1$ and $Q_2$, with the resistor R therebetween, are connected in series between a drain supply voltage $V_{DD}$ and ground. The transistor $Q_2$ is a normally-ON type FET. A drain electrode and a source electrode of the FET $Q_2$ are short-circuited, and thus the drain current $I_{DS}$ of the FET $Q_2$ is defined. The voltage drop across the resistor R generated by the drain current $I_{DS}$, i.e., $I_{DS} \times R$, determines the shift voltage $V_{SFT}$.

However, in this level shift circuit, the resistance value of the resistor R varies widely due to an error in the patterning size or variations of the process control conditions, as described above. As a result, the shift voltage $V_{SFT}$ varies widely and cannot be limited within the desired order. Accordingly, the resistor R made by the prior art cannot be utilized for the level shift circuit, from the viewpoint of accuracy.

Figure 2:
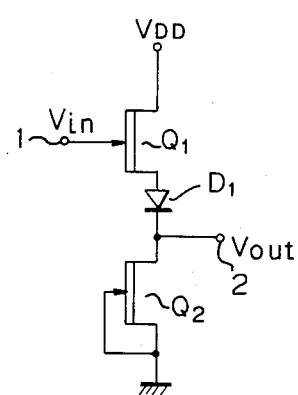

It is possible to use a Schottky diode as the level shift element, to obtain a shift voltage having a greater accuracy in comparison with the circuit of FIG. 1. FIG. 2 shows such a level shift circuit using a Schottky diode $D_1$ instead of the resistor R of FIG. 1.

The Schottky diode $D_1$ may be formed on the substrate during a manufacturing process which differs from the FET manufacturing process. However, in the case of the MESFET, the diode $D_1$ may be formed during the same manufacturing process as for the junction between the gate electrode and the channel of the MESFET. This kind of Schottky diode is preferable for obtaining an accurate shift voltage, since the forward rise voltage thereof is almost constant.

When the Schottky diode is formed on the GaAs substrate using $WS_i$ as the metal, one Schottky diode may provide a shift voltage of about 0.6 V.

When, however, this method of using the Schottky diode is utilized, an arbitrary choice of the shift voltage cannot be made, despite the high accuracy of the shift voltage. Namely, only the shift voltage of a multiple of the voltages of more than one diode can be utilized, by connecting a plurality of Schottky diodes in series.

Figure 3:
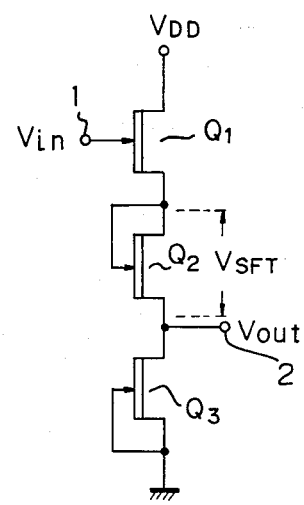
FIG. 3 shows a level shift circuit using the semiconductor resistance element according to the present invention.

A preferred embodiment of the present invention will now be explained with reference to FIGS. 3 to 6. FIG. 3 shows an embodiment of a level shift circuit using a resistance element according to the present invention as the voltage shift element. FIG. 3, $Q_1$, $Q_2$, and $Q_3$ are normally-ON type MESFET's formed on the semiconductor substrate, respectively. These MESFET's are formed during the same manufacturing process. The drain and gate electrodes of the MESFET $Q_2$ are short-circuited, and the source and gate electrodes of the MESFET $Q_3$ are also short-circuited. 1 is an input terminal, and 2 an output terminal. The MESFET $Q_2$ functions as the resistance element according to the present invention. MESFET $Q_3$ functions as a constant current source for maintaining the drain current of the MESFET $Q_2$ at a constant value.

Figure 4A:
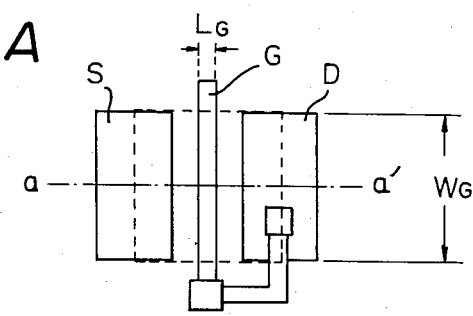
FIG. 4A and FIG. 4B show the physical structure of the MESFET.
Figure 4B:
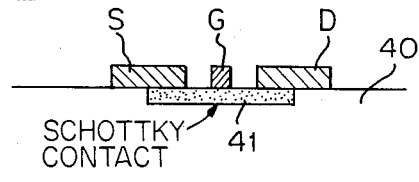

FIGS. 4A and 4B show the physical structure of a MESFET. FIG. 4A is a top view of the semiconductor substrate, and FIG. 4B is cross-sectional view taken along the line a—a' in FIG. 4A. In FIGS. 4A and 4B, 40 is a semi-insulating substrate of GaAs, 41 an active layer formed on the semi-insulating substrate 40 by ion implantation, etc., D a drain electrode, G a gate electrode, and S a source electrode. Each electrode is formed on the active layer 41 The gate electrode G and the drain electrode D are short-circuited. The gate electrode G is held in contact with the active layer 41 by a Schottky contact, and the drain and source electrodes D and S are held in contact with the active layer 41 by an ohmic contact. The Schottky contact is formed by the contact surface between gate electrode G and active layer 41.

Figure 5A:
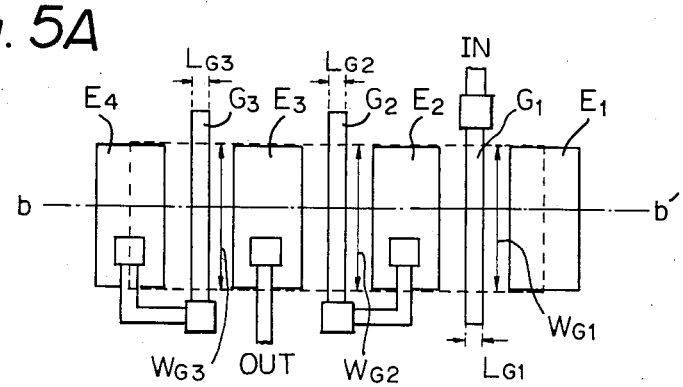
FIG. 5A and FIG. 5B show the physical structure of the level shift circuit of FIG. 3.
Figure 5B:
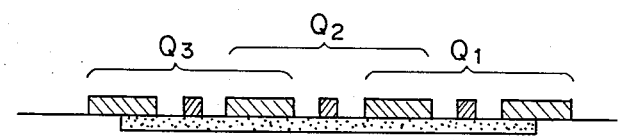

FIGS. 5A and 5B show a physical structure for realizing the circuit of FIG. 3. FIG. 5A is a top view, and FIG. 5B is a cross-sectional view taken along the line b—b' in FIG. 5A. In FIGS. 5A and 5B, $G_1$, $G_2$, and $G_3$ are gate electrodes of MESFET's $Q_1$, $Q_2$, and $Q_3$ respectively. The gate electrodes $G_1$, $G_2$, and $G_3$ have gate widths $W_{G1}$, $W_{G2}$, and $W_{G3}$ and gate lengths $L_{G1}$, $L_{G2}$, $L_{G3}$, respectively. The gate electrodes $G_1$ and $G_3$ are formed so that the gate widths $W_{G1}$ and $W_{G3}$ become equal. $L_{G1}$, $L_{G2}$, and $L_{G3}$ are formed to be equal. $E_1$ is the drain electrode of the MESFET $Q_1$, and $E_2$ an electrode commonly used as the source electrode of the MESFET $Q_1$ and the drain electrode of the MESFET $Q_2$. This electrode $E_2$ is short-circuited with the gate electrode $G_2$. $E_3$ is an electrode commonly used as the source electrode of the MESFET $Q_2$ and the drain electrode of the MESFET $Q_3$. This electrode E is connected to the output terminal 2. $E_4$ is the source electrode of MESFET $Q_3$, and is connected to the gate electrode $G_3$.

As explained hereinafter, the MESFET $Q_2$ of FIG. 3 functions as the resistance element.

Figure 6:
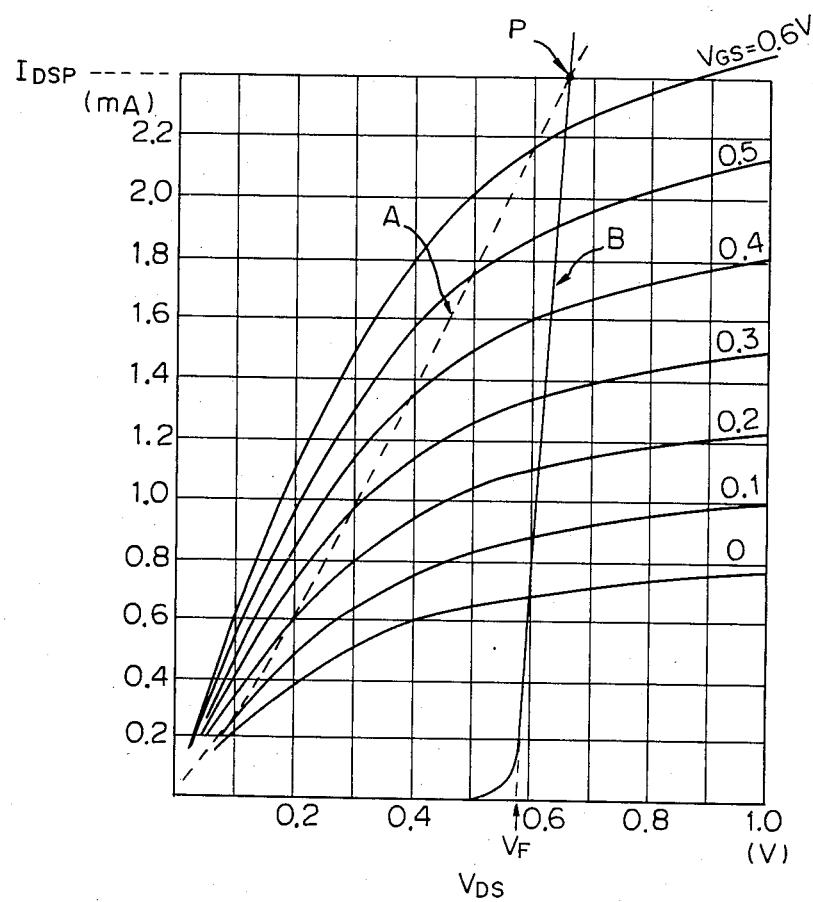
FIG. 6 shows a drain-source voltage versus a drain current characteristic of the MESFET.

That is, the drain-source voltage $V_{DS}$ versus a drain current $I_{DS}$ characteristic of the MESFET is shown in FIG. 6, in which an abscissa represents the drain-source voltage $V_{DS}$ [V], and an ordinate the drain current $I_{DS}$. The characteristic curves are denoted by taking a gate-source voltage $V_{GS}$ as a parameter.

In FIG. 6, the characteristic curve of the MESFET $Q_2$ as the resistance element, whose gate and drain electrodes are short-circuited, is denoted by a broken line A obtained by connecting points at which the drain-source voltage $V_{DS}$ and the gate-source voltage $V_{GS}$ are equal, since the potential of the drain electrode D and that of the gate electrode G are equal. As clear from FIG. 6, the characteristic curve represented by the broken line A is relatively linear. Accordingly, the MESFET $Q_2$ may be preferably utilized as the resistance element.

On the other hand, a curve B denotes a characteristic curve of a diode formed between the gate and source electrodes of the MESFET $Q_2$. The range wherein the MESFET $Q_2$ of the present invention may be utilized as the resistance element is limited in a left side region of the curve B, since in a right side region thereof the diode formed between gate and source electrodes is biased in the forward direction so that the gate current flows.

A rise voltage $V_F$ (dc turn on voltage) of the curve B is about 0.6 V, and above this rise voltage $V_F$, the forward current of the diode flows from the gate electrode to the source electrode. Accordingly, the shift voltage $V_{SFT}$ obtained by using the MESFET $Q_2$ as the resistance element must be below this rise voltage $V_F$. That is, a limitation exists in that the drain current $I_{DS}$ flowing through the MESFET $Q_2$ must be lower than the drain current $I_{DSP}$ at the intersecting point P of both curves A and B in FIG. 6.

The operation of the level shift circuit of FIG. 3 is as follows. The drain current $I_{DSP}$ flowing through the MESFET $Q_2$ is regulated to a constant current lower than the aforementioned drain current $I_{DSP}$ by the MESFET $Q_3$ as the constant current supply source, whereby the MESFET $Q_2$ functions as the resistance element. In this circuit, the MESFET's $Q_1$ and $Q_3$ are formed during the same manufacturing process and thus have the same characteristic. Therefore, when the same drain current $I_{DS}$ flows through the MESFET's $Q_1$ and $Q_3$, the gate-source voltage $V_{GS1}$ of the MESFET $Q_1$ becomes zero, since the gate and source electrodes of the MESFET $Q_3$ are short-circuited so that the gate-source voltage $V_{GS3}$ thereof becomes zero. Accordingly, the voltage $V_{in}$ input to the input terminal 1 is shifted by the shift voltage $V_{SFT}$ caused at the MESFET $Q_2$, and is then output from the output terminal 2.

As described above, in the level shift circuit of FIG. 3, the shift voltage $V_{SFT}$ caused at the FET $Q_2$ can be held at a constant value by regulating the drain current $I_{DS}$ to the constant value by the FET $Q_3$. Further, if the drain current $I_{DS}$ is varied, the shift voltage $V_{SFT}$ may be changed with a high accuracy.

The relationship between the FET's $Q_2$ and $Q_3$ for setting the drain current $I_{DS}$ to the desired value, and at the same time satisfying the IDSP condition mentioned previously, will be explained hereinafter.

Various expressions for calculating the drain current $I_{DS}$ of the MESFET are known and, in general, the drain current $I_{DS}$ is proportional to the gate width $W_G$.

Assuming that the gate widths of FET's $Q_2$ and $Q_3$ are $W_{G2}$ and $W_{G3}$, respectively, the expression of the necessary condition for limiting the shift voltage $V_{SFT}$ to be below the rise voltage $V_F$ will be obtained as shown hereinafter.

Assuming that the FET $Q_3$ operates in the saturated region and the FET $Q_2$ in the linear region, the drain current $I_{DS2}$ of the FET $Q_2$ and the drain current $I_{DS3}$ of the FET $Q_3$ are expressed as follows.

$$I_{DS2} = \beta_2 V_{DS2} [2(V_{GS2} - V_{th2}) - V_{DS2}] \times (1 + \lambda_2 V_{DS2}) \quad (1)$$

$$I_{DS3} = \beta_3 (V_{GS3} - V_{th3})^2 (1 + \lambda_3 V_{DS3}) \quad (2)$$

where, $\beta_2$ and $\beta_3$ are the transfer conductance of the FET's $Q_2$ and $Q_3$, respectively, $\lambda_2$ and $\lambda_3$ are the channel length modulation coefficients of the FET's $Q_2$ and $Q_3$, respectively, $V_{th2}$ and $V_{th3}$ are the threshold voltages of the FET's $Q_2$ and $Q_3$, respectively, $V_{DS2}$ and $V_{DS3}$ are the drain-source voltages of the FET's $Q_2$ and $Q_3$, respectively, and, $V_{GS2}$ and $V_{GS3}$ are the gate-source voltages of the FET's $Q_2$ and $Q_3$, respectively, Since the gate and drain electrodes of the FET $Q_2$ are short-circuited, $V_{GS2}$ is equal to $V_{DS2}$.

$$V_{GS2} = V_{DS2}$$

Assuming that the current flowing from the output terminal 2 is zero, $I_{DS2}$ is equal to $I_{DS3}$. Accordingly, from the expressions (1) and (2), the following expression is obtained.

$$\beta_2 V_{DS2}[2(V_{GS2} - V_{th2}) - V_{DS2}](1 + \lambda_2 \times V_{DS2}) = \quad (3)$$
$$\beta_3 (V_{GS3} - V_{th3})^2 (1 + \lambda_3 V_{DS3})$$

Since the drain-source voltage $V_{DS2}$ corresponds to the shift voltage $V_{SFT}$, $V_{DS2}$ should be limited to be lower than the rise voltage $V_F$.

When the FET's $Q_2$ and $Q_3$ are formed during the same manufacturing process, the threshold voltages $V_{th2}$ and $V_{th3}$ become the same value and are equal to $V_{th}$. Since transfer conductances $\beta_2$ and $\beta_3$ are proportional to the gate-width $W_{G2}$ and $W_{G3}$ respectively, the following relationship is obtained $$\frac{\beta_2}{\beta_3} = \frac{W_{G3}}{W_{G2}}$$

Now, neglecting channel length modulation coefficients $\lambda_2$ and $\lambda_3$ for simplification, the shift voltage $V_{SFT}$ is obtained as follows from the expression (3).

$$V_{SFT} = V_{DS2} = V_{th}\left[1 - \left(1 + \frac{W_{G3}}{W_{G2}}\right)^{\frac{1}{2}}\right] \quad (4)$$

Since the range capable of using the FET $Q_2$ as the resistance element is limited to be below the rise voltage $V_f$, the following relationship is obtained.

$$V_F > V_{th}\left[1 - \left(1 + \frac{W_{G3}}{W_{G2}}\right)^{\frac{1}{2}}\right] \quad (5)$$

Accordingly, by determining the gate widths $W_{G2}$ and $W_{G3}$ of the FET's $Q_2$ and $Q_3$ so as to satisfy the expression (5), the FET $Q_2$ may function as the resistance element.

In the above explanation, it is assumed that the FET's $Q_2$ and $Q_3$ have the same characteristic. On the other hand, when the FET's $Q_2$ and $Q_3$ have a different characteristic, the relationship $V_f > V_{DS2}$ is applied to the drain-source voltage $V_{DS2}$ obtained by expanding the expression (3).

Given the desired shift voltage $V_{SFT}$ and the saturation current (at the state $V_{GS}=0$) flowing through the FET $Q_3$, the necessary gate-widths $W_{G2}$ and $W_{G3}$ are determined by the following procedure.

First, several MESFET's, each having the same device parameters such as gate-length and source and drain impurity regions, etc., except for varying the change in the gate width, are provided and then tested to obtain the characteristic curves such as shown in FIG. 6 from each MESFET, whereby the necessary gate width $W_{G3}$ of the FET $Q_3$ is determined on the basis of the aforementioned characteristic curves, since the drain current is proportional to the gate-width.

Next, when the FET $Q_2$ is formed so that the device parameters except the gate width are equal to those of the FET $Q_3$, the size range of the gate width $W_{G2}$ of the FET $Q_2$ is obtained from the expression (4), and the necessary gate width $W_{G2}$ for generating the desired shift voltage $V_{SFT}$ is determined within the size range on the basis of the expression (3).

In the practice of designing an integrated circuit, FET's $Q_1$, $Q_2$, and $Q_3$ are closely disposed on the substrate, and gate widths of FET $Q_1$ and $Q_3$ are formed to have the same size. As described previously when the gate widths of the FET's $Q_1$ and $Q_3$ become equal, the characteristics of both FET's $Q_1$ and $Q_3$ become exactly the same, since they are formed during the same manufacturing process. As a result, the gate electric potential of the FET $Q_1$ and the source electric potential thereof become equal, due to the short-circuit between the gate and source electrodes of the FET $Q_3$. Accordingly, the output voltage $V_{out}$ becomes lower than the input voltage $V_{in}$ by the shift voltage $V_{SFT}$ caused at the FET $Q_2$.

The resistance element according to the present invention is resistant to variations in the process conditions and to temperature changes, for the reasons described hereinafter.

That is, even if each manufactured FET $Q_3$ has a different drain current value due to a different condition of the manufacturing process, the shift voltage $V_{SFT}$ corresponding to the drain-source voltage $V_{DS2}$ of the FET $Q_2$ does not vary widely. This is because the resistance of the FET $Q_2$ becomes small as the drain current $I_{DS3}$ of the FET $Q_3$ becomes large, since both of the FET's $Q_2$ and $Q_3$ are formed during the same manufacturing process, as a result, the drain-source voltage $V_{DS2}$ obtained by multiplying the drain current $I_{DS3}$ by the resistance of the FET $Q_2$ becomes almost constant.

The same is true for the temperature variation. That is, when the drain current $I_{DS3}$ of the FET $Q_3$ becomes large as the temperature increases, the equivalent resistance of the FET $Q_2$ becomes small in proportion to that increase. As a result, the shift voltage $V_{SFT}$ obtained b $I_{DS3} \times$ equivalent resistance of $Q_2$ is kept almost constant in spite of the variation of temperature.

Further, the same is true for the case where FET's $Q_2$ and $Q_3$ are formed during different manufacturing processes, respectively. That is because when FET's $Q_2$ and $Q_3$ are formed during different manufacturing process, if these FET's are formed on the same wafer, the characteristic of these FET's have a mutual relationship. Further, when the FET's $Q_2$ and $Q_3$ are closely disposed on the chip, the aforementioned effect appears remarkable due to the neighbouring mutual relationship of the FET's.

Although a preferred embodiment has been described heretofore, various modifications and alterations are possible within the scope of the present invention.

Figure 7:
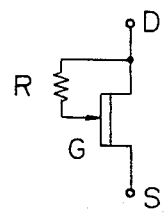
FIG. 7 shows an another embodiment of the resistance element according to the present invention.

For example, in the above-described example, the drain and gate electrodes are short-circuited. The same effect can be obtained, however, even if these electrodes are connected via the resistor. That is, FIG. 7 shows an another embodiment of the resistance element in the present invention. In this embodiment, a resistor is provided between the drain D and the gate G so that when an unexpected large voltage is applied to the drain D, the resistor R limits the gate current flowing from gate G and source S, which may destroy the gate junction. In normal operation, since there is no gate current, the resistor R does not have any bad effect on the resistance element characteristic in the present invention.

Figure 8:
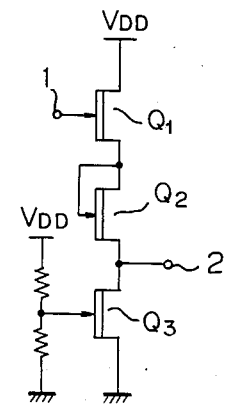
FIG. 8 to FIG. 10 show other embodiments of the level shift circuit using the resistance element according to the present invention, respectively.

Also, the method for defining the drain current of the MESFET $Q_3$ is not limited to the circuit shown in FIG. 3. For example, it is possible to bias the MESFET $Q_3$ to obtain the constant drain current as shown in FIG. 8.

Figure 9:
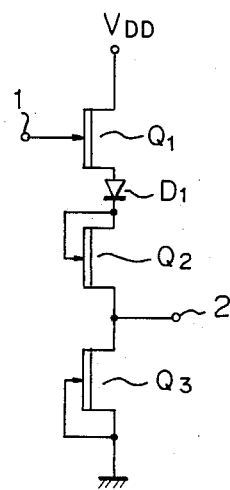
Figure 10:
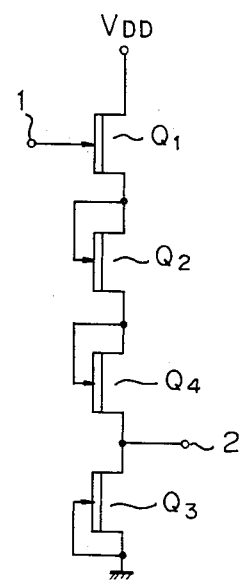

Further, when a shift voltage $V_{SFT}$ greater than the rise voltage $V_F$ is needed, the circuits shown in FIG. 9 and FIG. 10 may be utilized. That is, in FIG. 9, the Schottky diode $D_1$ is located between the FET's $Q_1$ and $Q_2$, thereby increasing the shift voltage $V_{SFT2}$ by about 0.6 V in comparison with the circuit of FIG. 3. Also, in FIG. 10, the resistance element is constituted by two FET's $Q_2$ and $Q_4$, and accordingly, the shift voltage $V_{SFT3}$ is doubled in comparison with the circuit shown in FIG. 3.

In the above-described example, the resistance element according to the present invention is constituted by a MESFET. However, the present invention is not limited to the MESFET, in that a JFET may be also utilized as the resistance element of the present invention, since the JFET has fundamentally the same characteristic as that of the MESFET. In this case, the rise voltage $V_F$ of the diode between the gate and source electrodes of the JFET becomes almost 1.2 V, which is higher than that of the MESFET, but the residual characteristics are almost equal.

In addition, in the present invention, the JFET includes a PN junction type FET and a heterojunction type FET such as an HEMT (High Electron Mobility Transistor), etc., but does not include the MOS type FET. Accordingly, the present invention is not applied to a circuit using the MOS type FET.

Figure 11:
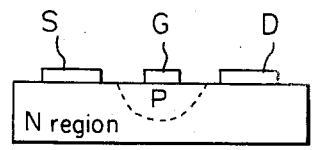
FIG. 11 and FIG. 12 show the physical structure of a PN junction gate FET and a HEMT, respectively; and, FIG. 13 and FIG. 14 show other applied circuits using the resistance element according to the present invention.
Figure 12:
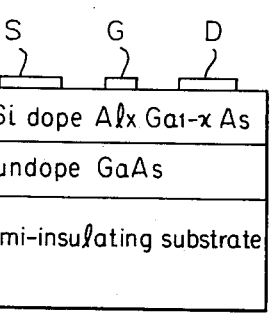

The physical structures of the PN junction type FET and the HEMT are shown in FIGS. 11 and 12, respectively. In FIG. 11, the gate electrode G is in contact with the N type semiconductor layer through a PN junction. Also, in FIG. 12, the gate electrode is in contact with the semiconductor layer through a heterojunction.

Furthermore, in the above-described example, the level shift circuit is used for explaining the applied circuit of the resistance element of the present invention. Nevertheless, the applied circuit of the resistance element of the present invention is not, of course, limited to the level shift circuit, since the present invention can be applied to various types of circuits, as shown, for example, in FIGS. 13 and 14.

Figure 13:
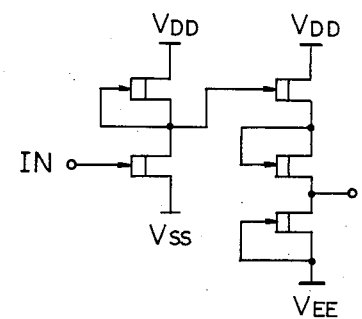
Figure 14:
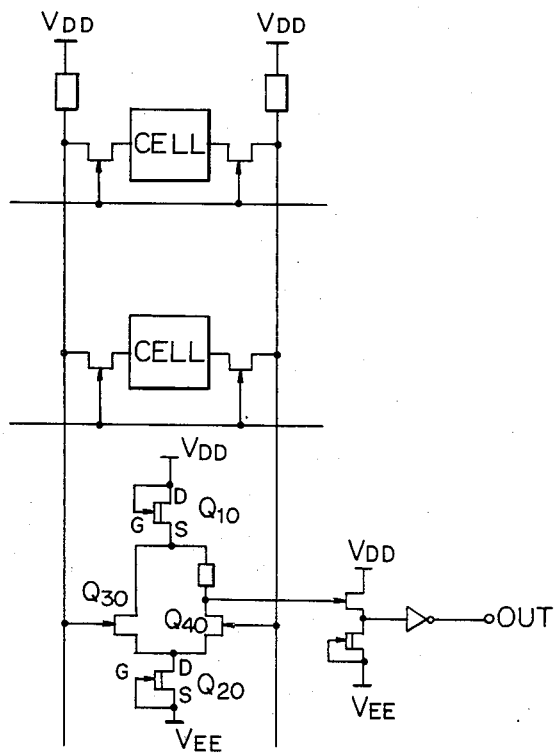

In FIG. 13, the resistance element according to the present invention is used for the buffer stage of a buffered FET logic circuit. In FIG. 14, the resistance element $Q_{10}$ according to the present invention is used for the level shift means of a sense amplifier in the semiconductor memory device by connecting it between the differential amplifier $Q_{20}$, $Q_{30}$, $Q_{40}$ and the power supply $V_{DD}$. The resistance element $Q_{10}$ and the constant current $Q_{20}$ are connected in series between the power supplies $V_{DD}$ and $V_{EE}$.

I claim:

1. A semiconductor integrated circuit, including a resistance element formed on a semiconductor substrate, said resistance element comprising:

A first FET formed on the semiconductor substrate and having drain and gate electrodes interocnnected and a source electrode, and said first FET having a diode with a turn-on voltage and formed between the gate and source electrodes of said first FET; and means for limiting the drain current and limiting the drain-source voltage of said first FET to a value below said turn-on voltage.

2. A semiconductor integrated circuit, comprising:

a semiconductor substrate;

a resistance element formed in said semiconductor substrate, comprising:

a first FET having drain and gate electrodes interconnected, and having a diode formed between the gate and source electrodes to limit a drain current of said first FET so that a drain-source voltage of said first FET is limited to be below a turn-on voltage of the diode; and a second FET coupled to said first FET and formed on said semiconductor substrate during a same manufacturing process as for said first FET.

3. A level shift circuit, used in an integrated circuit, comprising:

a first power supply;

a second power supply having a voltage lower than said first power supply;

a first Schottky gate type or junction gate type FET having a gate electrode to which an input voltage is applied;

a second schottky gate type or junction gate type FET functioning as a constant current source;

a semiconductor resistance element comprising a Schottky gate type FET or junction gate type FET having drain and gate electrodes interconnected and a source electrode, and having a diode formed between the gate and source electrodes of said Schottky gate or junction gate type FET, a drain current of said semiconductor resistance element being limited by said second FET, so that a drain-source voltage of said semiconductor resistance element is limited to be below a turn-on voltage of said diode, the first and second FET's and the semiconductor resistance element located between said first and second FET's being connected in series between the first power supply and the second power supply, the connection between said second FET and said semiconductor resistance element forming an output terminal.

4. A level shift circuit according to claim 3, wherein the first and second FET's are formed during the same manufacturing process so as to have the same characteristic.

5. A level shift circuit according to claim 3, wherein the drain and gate electrodes of the second FET are short-circuited to operate as the constant current source.

6. A level shift circuit according to claim 3 wherein the gate electrode of the second FET is biased to a constant voltage by means of a resistor voltage divider.

7. A level shift circuit according to claim 3, wherein the drain current of the semiconductor resistance element is determined determined the gate width of the Schottky or junction gate FET on the basis of the following expression:

$$V_F > V_{th} \left[ 1 - \left( 1 + \frac{W_{G3}}{W_{G2}} \right)^{\frac{1}{2}} \right]$$

where; $V_F$ is a dc forward voltage of the diode between the drain and gate electrodes of the Schottky or junction gate type FET;
$V_{th}$ is a threshold voltage of both the second and the Schottky or junction gate type FET;
$V_{G3}$ is a gate width of the second FET;
$W_{G2}$ is a gate width of the Schottky or junction gate type FET as a semiconductor resistance element.

8. A level shift circuit according to claim 3 and further including a Schottky contact, wherein said semiconductor resistance element is a MESFET formed on a semiconductor substrate having an active layer, said MESFET having a gate electrode held in contact with said active layer by a Schottky contact.

9. A level shift circuit according to claim 3 and further including a PN contact, wherein said semiconductor resistance element is a junction type FET formed on a semiconductor substrate having an active layer, said FET having a gate electrode held in contact with the active layer by said FN contact.

10. A level shift circuit according to claim 3 and further including a heterojunction, wherein said semiconductor resistance element is a Schottky gate type FET formed on a semiconductor substrate having an active layer, said FET having a gate electrode held in contact with the active layer by said heterojunction.

11. A semiconductor integrated circuit, comprising:
a first power supply supplying a first voltage;
a second power supply supplying a second voltage lower than said first voltage;
a constant current source element comprising a Schottky gate type FET or junction gate type FET;
a semiconductor resistance element, having a drain current and a drain-source voltage, comprising a Schottky gate type FET or junction gate type FET having a source electrode, a gate electrode, and a drain electrode, said drain and gate electrodes interconnected, said semiconductor resistance element and said constant current source element coupled in series between said first and second power supplies at a connection point, and having a diode with a turn-on voltage and coupled between the gate and source electrodes of said semiconductor resistance element; and
an output terminal connected to the connection point, the drain current of said semiconductor resistance element being limited by said constant current source element limiting a drain-source voltage of said semiconductor resistance element to a level lower than the turn-on voltage of said diode.

12. A semiconductor integrated circuit, comprising:
a first power supply supplying a first voltage;
a second power supply supplying a voltage lower than said first voltage;
a pair of driving FETs having commonly connected source electrodes and each having gate electrodes receiving input voltages and drain electrodes;
a constant current source element comprising a Schottky gate type FET or junction gate type FET having a drain electrode coupled to the source electrodes of said pair of driving FETs, and a source coupled to said second power supply;
a semiconductor resistance element, having a drain current and a drain-soure voltage, drain and gate electrodes interconnected and a source electrode coupled to the drain electrodes of said pair of driving FETs, said drain electrode of said semiconductor resistance element being coupled to said first power supply, and including a diode, having a turn-on voltage, coupled between the gate and source electrodes of said semiconductor resistance element; and
an output terminal operatively connected to the drain of one of said driver FETs, and said constant current source element limiting the drain current of said semiconductor resistance element by limiting the semiconductor resistance element drain-source voltage to below the turn-on voltage of said diode.

13. A level shift circuit used in an integrated circuit, comprising:
a power supply;
a first FET having a gate electrode to which an input voltage is applied;
a second FET functioning as a constant current source; and
a semiconductor resistance element comprising a Schottky gate type FET or junction gate type FET having a drain and gate electrodes interconnected and a source electrode, and having a diode formed between the gate and source electrode of said Schottky or junction gate type FET, a drain current of said semiconductor resistance element being limited so that a drain-source voltage of said semiconductor resistance element is limited to be below a forward turn-on voltage of said diode, said first and second FET's and said semiconductor resistance element located between said first and second FET's being connected in series between the power supply and ground, and the first and second FETs being formed during a same manufacturing process and having the same characteristics.

14. A level shift circuit used in an integrated circuit, comprising:
a power supply;
a first FET having a gate electrode to which an input voltage is applied;
a second FET having a gate electrode and a drain electrode short circuited forming a constant current source; and
a semiconductor resistance element comprising a Schottky gate type FET or junction gate type FET having drain and gate electrodes interconnected and a source electrode and having a diode formed between the gate and source electrode of said Schottky or junction gate type FET, a drain current of said semiconductor resistance element being limited so that a drain-source voltage of said semiconductor resistance element is limited to be below a forward turn-on voltage of said diode, said first and second FET's and said semiconductor resistance element located between said first and second FET's being connected in series between the power supply and ground.

15. A level shift circuit used in the integrated circuit comprising:
   a power supply;
   a first FET having a gate electrode to which an input voltage is applied;
   a second FET functioning as a constant current source; and
   a semiconductor resistance element comprising a Schottky gate type FET or junction gate type FET having drain and gate electrodes interconnected and a source electrode; and
   a diode formed between the gate and source electrode of said Schottky or junction gate type FET, a drain current of said semiconductor resistance element being limited so that a drain-source voltage of said semiconductor resistance element is limited to be below a forward turn-on voltage of said diode, said first and second FET's and said semiconductor resistance element located between said first and second FET's being connected in series between the power supply and ground, the drain current being determined by determining the gate width of the Schottky or junction gate type FET on the basis of the following expression:

$$V_F > V_{th}\left[1 - \left(1 + \frac{W_{G3}}{W_{G2}}\right)^{\frac{1}{2}}\right]$$

where $V_F$ is a dc forward voltage of the diode between the drain and gate electrodes of Schottky or junction gate type FET;
   $V_{th}$ is a threshold voltage of both the second and the Schottky or junction gate type FET;
   $V_{G3}$ is a gate width of the second FET; and
   $W_{G2}$ is a gate width of the Schottky or junction gate type FET.

* * * * *